(12) United States Patent
Lin et al.

(10) Patent No.: US 7,933,147 B2
(45) Date of Patent: Apr. 26, 2011

(54) SENSING CIRCUIT OF A PHASE CHANGE MEMORY AND SENSING METHOD THEREOF

(75) Inventors: Lieh-Chiu Lin, Kaohsiung (TW); Shyh-Shyuan Sheu, Taichung (TW); Pei-Chia Chiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 615 days.

(21) Appl. No.: 11/968,041

(22) Filed: Dec. 31, 2007

(65) Prior Publication Data

US 2008/0316803 A1 Dec. 25, 2008

(30) Foreign Application Priority Data

Jun. 25, 2007 (TW) ................................ 96122876 A

(51) Int. Cl.
G11C 11/00 (2006.01)
(52) U.S. Cl. ..................... 365/163; 365/196; 365/210.1; 365/203
(58) Field of Classification Search .................. 365/163, 365/196, 210, 203
See application file for complete search history.

(56) References Cited

U.S. PATENT DOCUMENTS

| | | | |
|---|---|---|---|
| 5,036,492 A | | 7/1991 | Runaldue |
| 5,699,295 A | * | 12/1997 | Yero ........................ 365/185.21 |
| 5,717,640 A | * | 2/1998 | Hashimoto .............. 365/189.07 |
| 5,787,042 A | | 7/1998 | Morgan |
| 5,889,702 A | * | 3/1999 | Gaultier et al. ............ 365/185.2 |
| 6,314,014 B1 | | 11/2001 | Lowrey et al. |
| 6,434,068 B1 | * | 8/2002 | Harada et al. ................. 365/201 |
| 6,590,807 B2 | | 7/2003 | Lowrey |
| 6,667,900 B2 | | 12/2003 | Lowrey et al. |
| 6,707,712 B2 | | 3/2004 | Lowery |
| 6,711,080 B2 | * | 3/2004 | Kern et al. ............... 365/189.15 |
| 6,731,528 B2 | | 5/2004 | Hush et al. |
| 6,791,859 B2 | | 9/2004 | Hush et al. |
| 6,791,885 B2 | | 9/2004 | Casper et al. |
| 6,845,052 B1 | | 1/2005 | Ho et al. |
| 2007/0133269 A1 | | 6/2007 | Lee et al. |

FOREIGN PATENT DOCUMENTS

CN 1549451 A 11/2004

* cited by examiner

*Primary Examiner* — Pho M Luu

(57) ABSTRACT

A sensing circuit of a phase change memory. The sensing circuit comprises a data current source and a reference current source, a storage memory device and a reference memory device, a storage switch and a reference switch, an auxiliary current source and a comparator. First terminals of the storage memory device and the reference memory device are respectively coupled to the data current source and the reference current source. The storage switch and the reference switch are respectively coupled to second terminals of the storage memory device and the reference memory device. The auxiliary current source is dynamically coupled to the first terminals of the storage memory device and the reference memory device. The comparator is coupled to the first terminals of the storage memory device and the reference memory device.

5 Claims, 5 Drawing Sheets

SENSING CIRCUIT OF A PHASE CHANGE MEMORY AND SENSING METHOD THEREOF

BACKGROUND OF THE INVENTION

1. Field of the Invention

The invention relates to a phase change memory and, in particular, to a sensing circuit of a phase change memory.

2. Description of the Related Art

FIG. 1 is a conventional sensing circuit of a phase change memory. In FIG. 1, a current $I_R$ flows thorough a phase change memory cell 115. Since resistance of the phase change memory cell 115 changes with a storage state thereof, a voltage drop generated across the phase change memory cell 115 by the current $I_R$ also changes. The voltage drop is transferred to a comparator 130 and compared with a reference voltage $V_{REF}$ such that a storage state of the phase change memory 115 is detected. Generally, the comparator 130 is an analog circuit which is designed to detect small differences. Since RC loading of a bit line delays the process of converting a current to a voltage, reading speed is slowed down.

FIG. 2 is a sensing circuit of a phase change memory disclosed in U.S. Pat. No. 5,787,042. In FIG. 2, data bit lines is pre-charged to Vdd/2 and an equalizer is then disconnected. Voltages of the data bit lines migrate to opposite directions from the pre-charge voltage and a logic value of data is read out. Since the sensing circuit therein is a latch, two input terminals thereof are coupled to the complementary bit lines and receive differential signals to provide an adequate sensing margin. As a result, two memory cells are required to store a data bit and area required is twice that of a memory array which only requires a single memory cell to store a data bit.

BRIEF SUMMARY OF THE INVENTION

An embodiment of a sensing circuit of a phase change memory comprises a data current source and a reference current source, a storage memory device and a reference memory device, a storage switch and a reference switch, an auxiliary current source and a comparator. First terminals of the storage memory device and the reference memory device are respectively coupled to the data current source and the reference current source. The storage switch and the reference switch are respectively coupled to second terminals of the storage memory device and the reference memory device. The auxiliary current source is dynamically coupled to the first terminals of the storage memory device and the reference memory device. The comparator is coupled to the first terminals of the storage memory device and the reference memory device.

An embodiment of a sensing method for a phase change memory comprises accelerated charging of a storage bit line or a reference bit line with an auxiliary current source when read process starts, and turning off the auxiliary current source within a predetermined period.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is the best-contemplated mode of carrying out the invention. This description is made for the purpose of illustrating the general principles of the invention and should not be taken in a limiting sense. The scope of the invention is best determined by reference to the appended claims.

Figure 1:
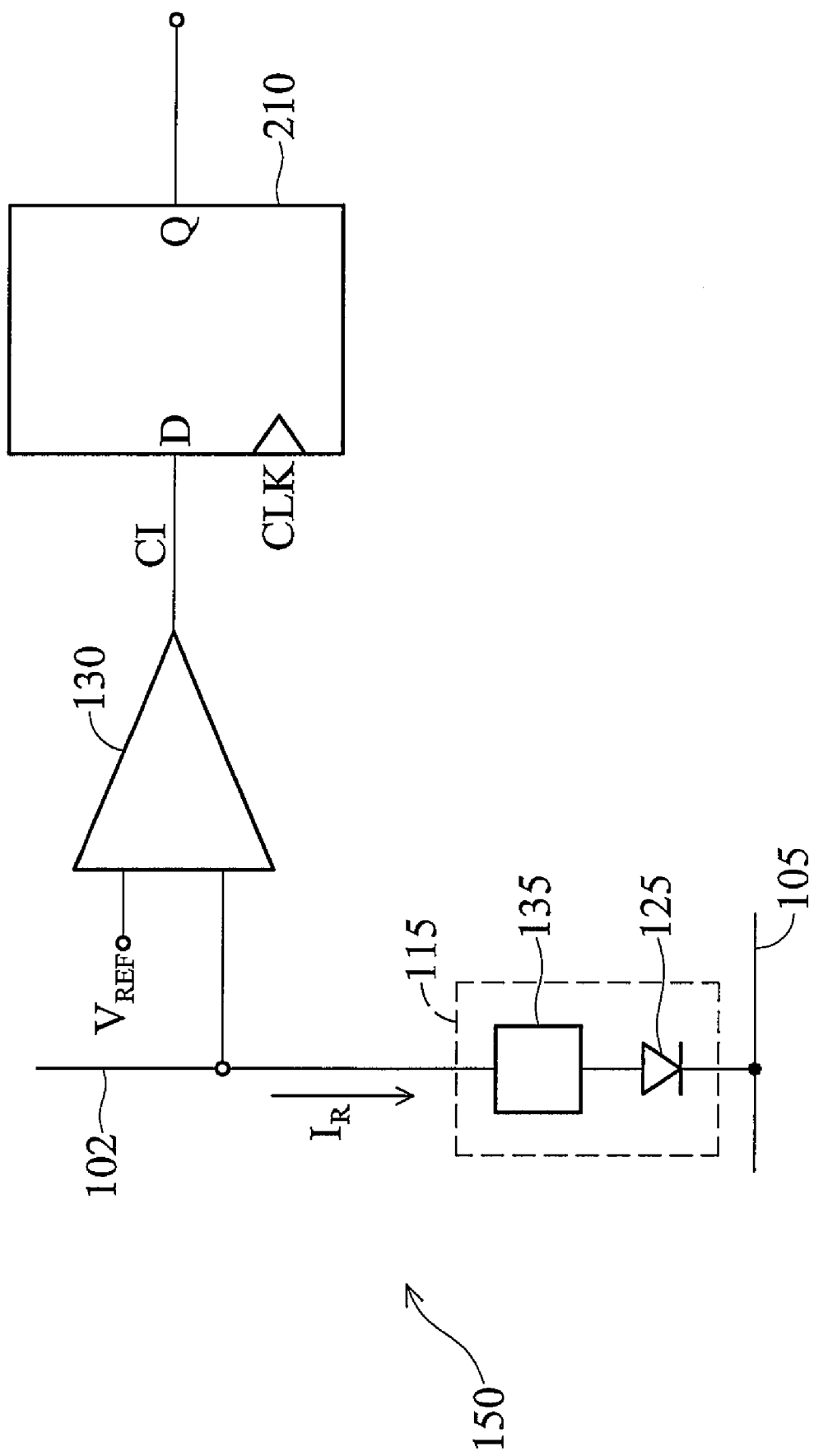
FIG. 1 is a conventional sensing circuit of a phase change memory.
Figure 2:
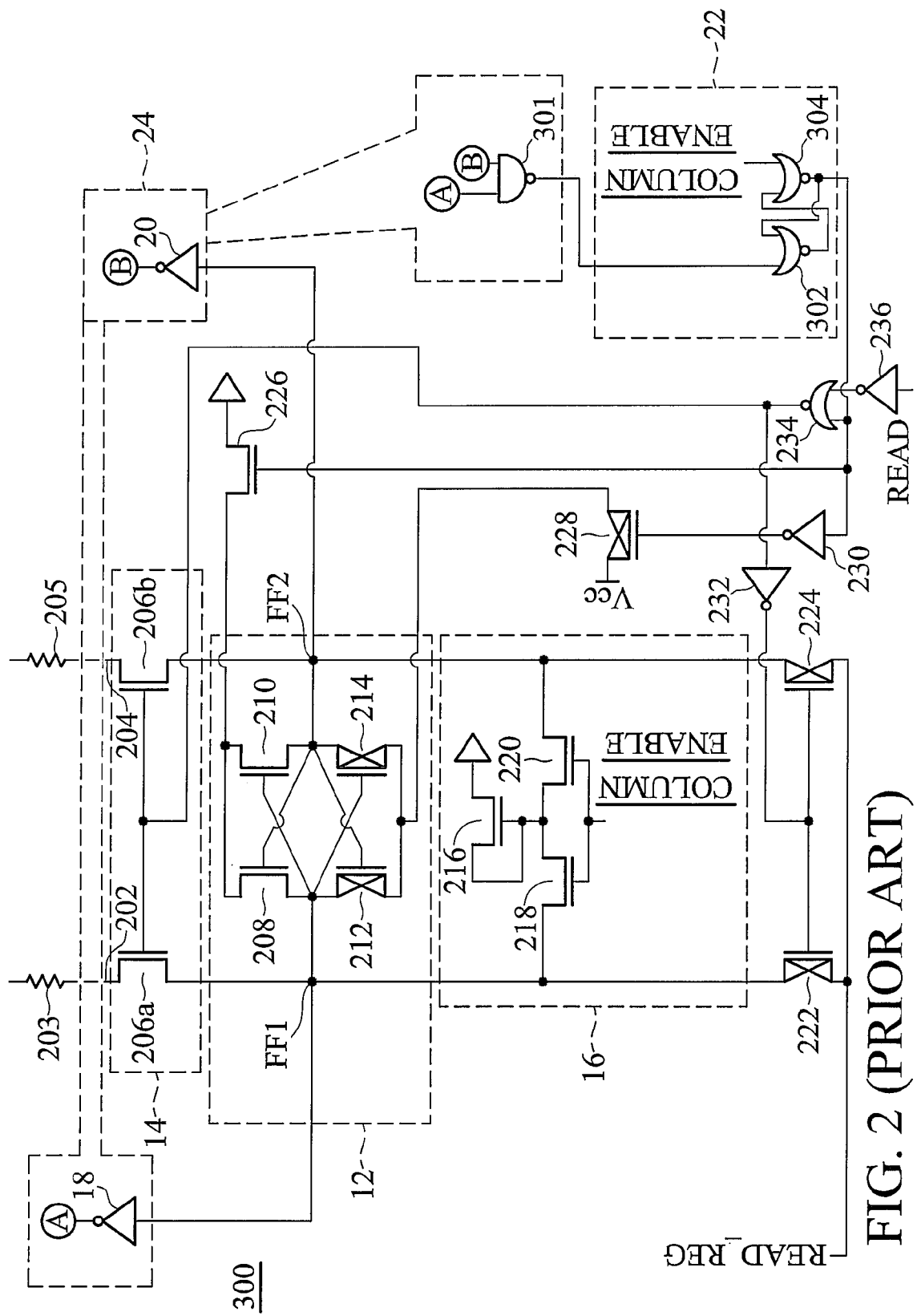
FIG. 2 is a sensing circuit of a phase change memory disclosed in U.S. Pat. No. 5,787,042.
Figure 3A:
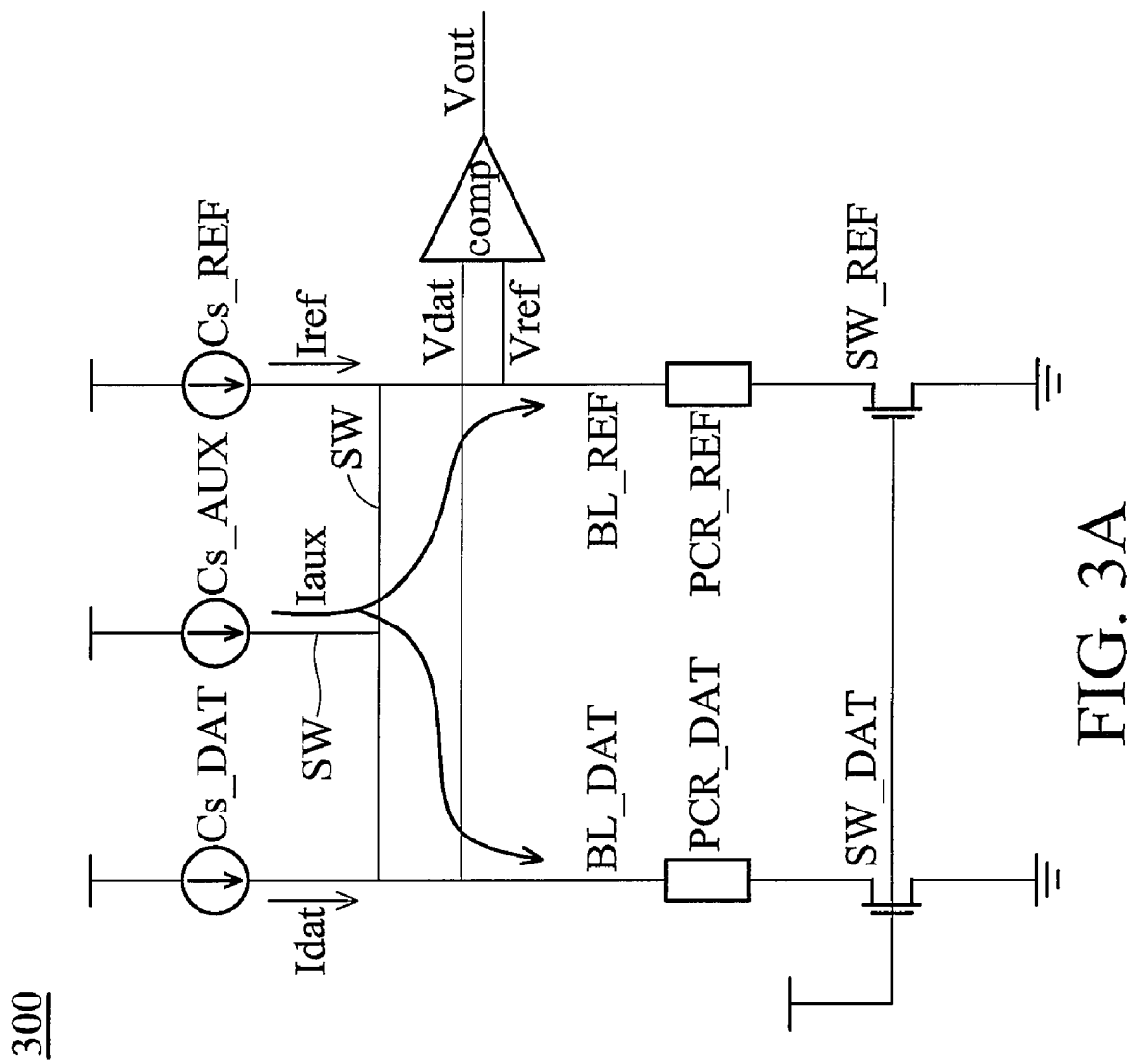
FIGS. 3A and 3B are schematic diagrams of a sensing circuit of a phase change memory according to an embodiment of the invention.
Figure 3C:
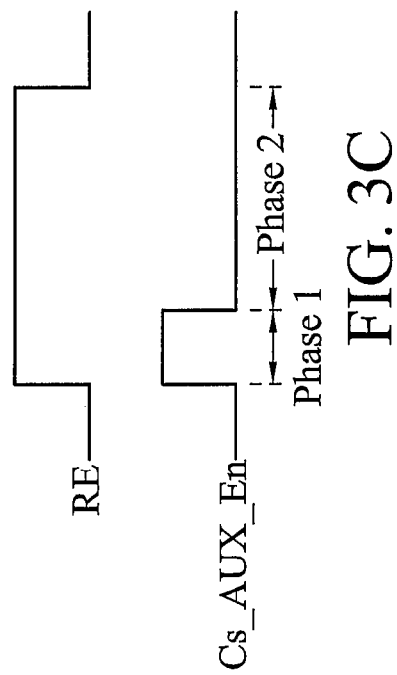
FIG. 3C is a schematic diagram showing waveforms of signals required by the sensing circuit in FIG. 3A or 3B.
Figure 3B:
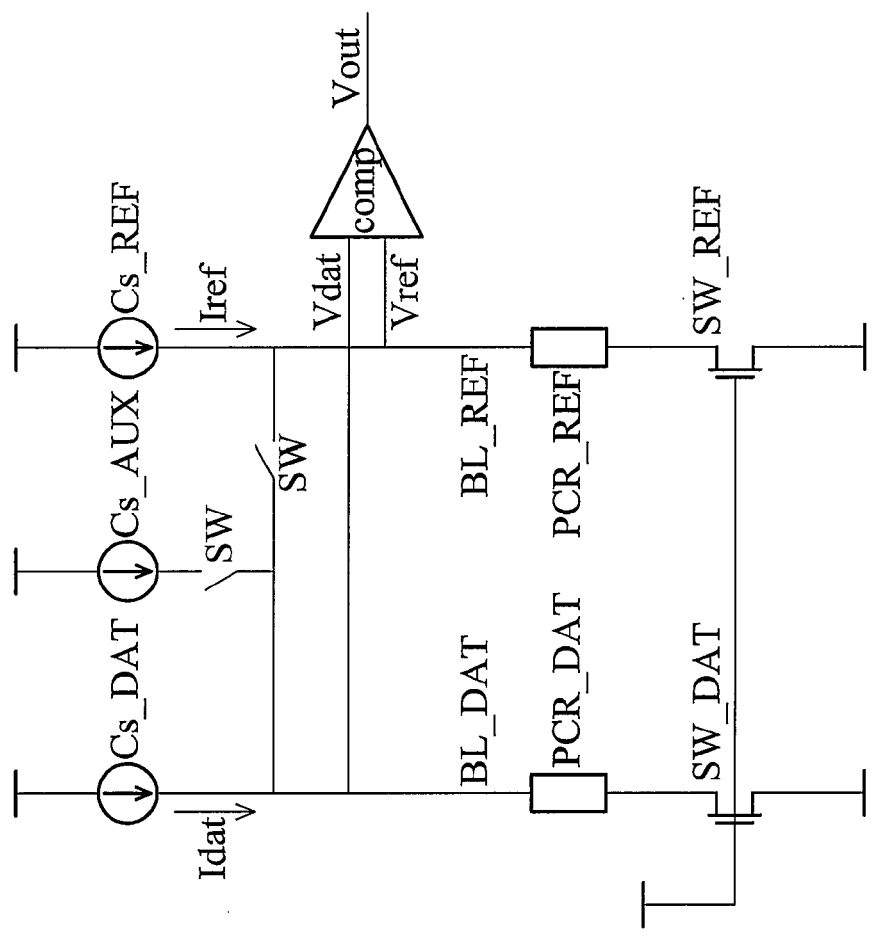

FIGS. 3A and 3B are schematic diagrams of a sensing circuit of a phase change memory according to an embodiment of the invention. The sensing circuit 300 comprises a data current source Cs_DAT and a reference current source Cs_REF, a storage memory device PCR_DAT and a reference memory device PCR_REF, a storage switch SW_DAT and a reference switch SW_REF, an auxiliary current source Cs_AUX and a comparator comp. First terminals of the data current source Cs_DAT and the reference current source Cs_REF are coupled to a supply voltage. First terminals of the storage memory device PCR_DAT and the reference memory device PCR_REF are respectively coupled to second terminals of the data current source Cs_DAT and the reference current source Cs_REF. More specifically, the storage memory device PCR_DAT and the reference memory device PCR_REF are phase change memory devices. The storage switch SW_DAT and the reference switch SW_REF are respectively coupled to second terminals of the storage memory device PCR_DAT and the reference memory device PCR_REF. The storage switch SW_DAT and the reference switch SW_REF can be bipolar junction transistors (BJTs), diodes, or the like. Preferably, the storage switch SW_DAT and the reference switch SW_REF are MOS transistors. The auxiliary current source Cs_AUX is dynamically coupled to the first terminals of the storage memory device PCR_DAT and the reference memory device PCR_REF via switches SW. The comparator comp is coupled to the first terminals of the storage memory device PCR_DAT and the reference memory device PCR_REF and receive the voltage levels Vdat and Vref. In addition, the comparator comp provides an output signal Vout as a read result of the storage state of the storage memory device PCR_DAT.

Operation of the sensing circuit 300 in FIGS. 3A and 3B can be divided into two stages. The first stage is an accelerated charging stage, as shown in FIG. 3A. In the accelerated charging stage, the switches SW are closed. Meanwhile, the auxiliary current source Cs_AUX provides auxiliary current Iaux to the data bit line BL_DAT of the storage memory device PCR_DAT and the reference bit line BL_REF of the reference memory device PCR_REF. Generally, since loading associated with the data bit line BL_DAT and the reference bit line BL_REF is large, it takes a long time to charge the bit lines. With the auxiliary current Iaux, time required to charge the bit lines is reduced. The second stage is a differentiation stage which starts within a predetermined period, as shown in FIG. 3B. In the differentiation stage, the switches SW are open. Meanwhile, the auxiliary current source Cs_AUX is disconnected from the data bit line BL_DAT of the storage memory device PCR_DAT and the reference bit line BL_REF of the reference memory device PCR_REF and stops providing the auxiliary current Iaux. Then, Vdat and Vref gradually stabilizes. The comparator detects the storage state of the storage memory device PCR_DAT according to the voltage levels Vdat and Vref.

FIG. 3C is a schematic diagram showing waveforms of signals required by the sensing circuit in FIG. 3A or 3B. RE represents read enable signal and a high state thereof stands for read stage of the memory cell. A delay element and the read enable signal RE can be utilized to generate an auxiliary current source enable signal Cs_AUX_En which control the switches SW. When voltage level of the auxiliary current source enable signal Cs_AUX_En is high, the switches are closed. The auxiliary current source Cs_AUX is connected to the data bit line BL_DAT of the storage memory device PCR_DAT and the reference bit line BL_REF of the reference memory device PCR_REF. When voltage level of the auxiliary current source enable signal Cs_AUX_En is low, the switches are open. The auxiliary current source Cs_AUX cannot provide auxiliary current Iaux to the data bit line BL_DAT and the reference bit line BL_REF.

Figure 4:
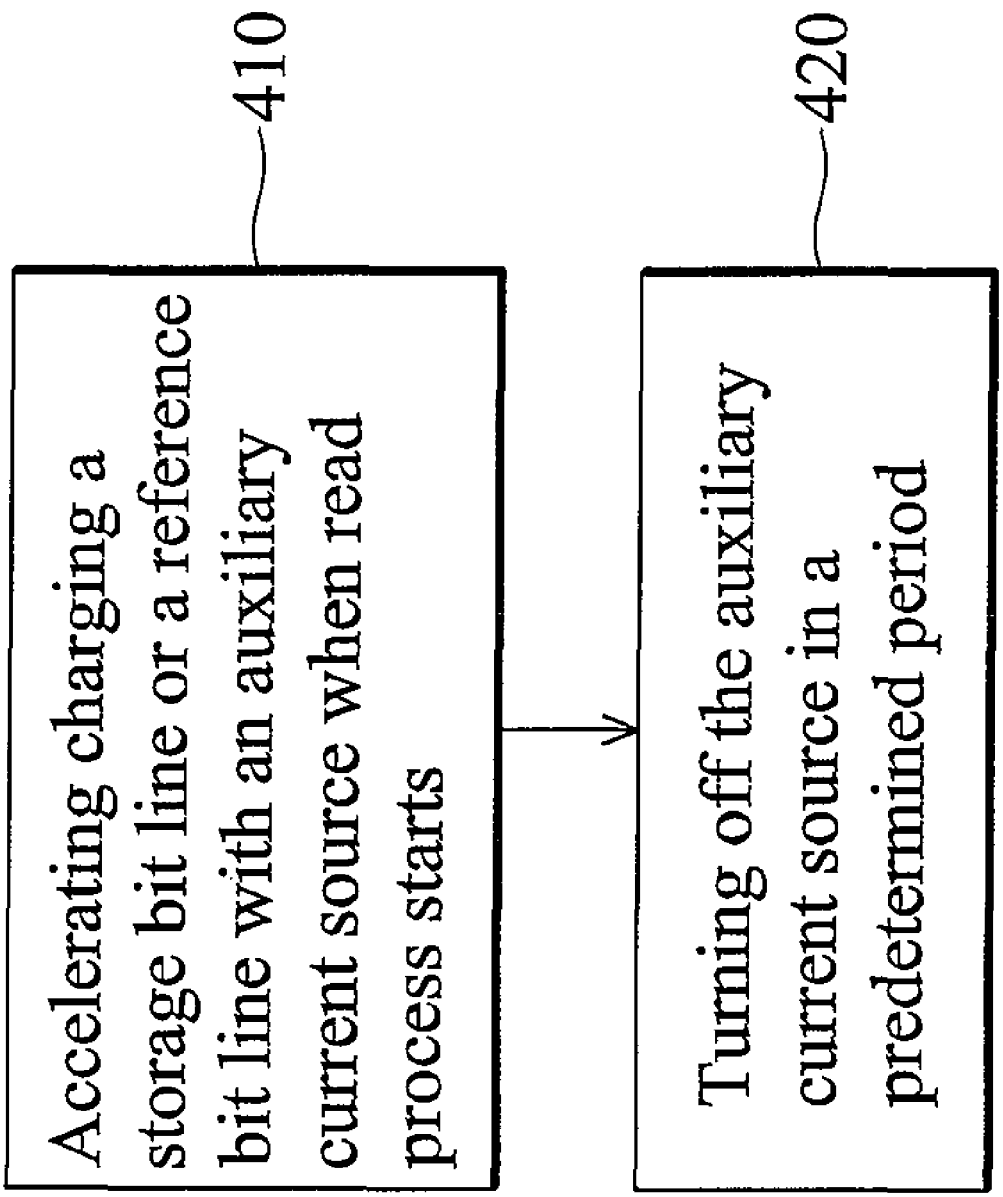
FIG. 4 is a flow chart of a sensing method for a phase change memory according to an embodiment of the invention.

FIG. 4 is a flow chart of a sensing method of a phase change memory according to an embodiment of the invention. The sensing method comprises accelerated charging of a storage bit line or a reference bit line with an auxiliary current source when read process starts (step 410), and turning off the auxiliary current source in a predetermined period (step 420).

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. A sensing circuit of a phase change memory, comprising:
   a data current source and a reference current source;
   a storage memory device and a reference memory device having first terminals respectively coupled to the data current source and the reference current source;
   a storage switch and a reference switch respectively coupled to second terminals of the storage memory device and the reference memory device;
   an auxiliary current source dynamically coupled to the first terminals of the storage memory device and the reference memory device; and
   a comparator coupled to the first terminals of the storage memory device and the reference memory device.

2. The sensing circuit of a phase change memory as claimed in claim 1, wherein the storage memory device and the reference memory device are phase change memory devices.

3. The sensing circuit of a phase change memory as claimed in claim 1, wherein the auxiliary current source is coupled to the first terminal of the storage memory device or the reference memory device via a switch.

4. The sensing circuit of a phase change memory as claimed in claim 3, wherein the switch is turned on when read process starts and turned off within a predetermined period.

5. The sensing circuit of a phase change memory as claimed in claim 1, wherein the storage switch and the reference switch are MOS transistors, BJTs, or diodes.

* * * * *